US009960337B2

(12) United States Patent
Huang et al.

(10) Patent No.: US 9,960,337 B2
(45) Date of Patent: May 1, 2018

(54) THERMOELECTRIC CONVERTER

(71) Applicant: Industrial Technology Research Institute, Chutung, Hsinchu (TW)

(72) Inventors: Chao-Jen Huang, Hsinchu (TW); Yuan-Hua Chu, Hsinchu (TW); Hung-Chang Chu, Hsinchu (TW); Pin-Chen Wang, Hsinchu (TW); Fang-Chih Chu, Hsinchu (TW)

(73) Assignee: Industrial Technology Research Institute, Chutung Township, Hsinchu (TW)

( * ) Notice: Subject to any disclaimer, the term of this patent is extended or adjusted under 35 U.S.C. 154(b) by 89 days.

(21) Appl. No.: 15/269,670

(22) Filed: Sep. 19, 2016

(65) Prior Publication Data
US 2018/0047888 A1 Feb. 15, 2018

(30) Foreign Application Priority Data

Aug. 11, 2016 (TW) .............................. 105125590 A

(51) Int. Cl.
*H01M 10/613* (2014.01)
*H01L 35/32* (2006.01)
(Continued)

(52) U.S. Cl.
CPC .......... *H01L 35/32* (2013.01); *F28D 15/0233* (2013.01); *F28D 15/0275* (2013.01);
(Continued)

(58) Field of Classification Search
CPC ......... H01L 35/00; H01L 35/30; H01L 35/32; H01L 35/34; H01M 10/647;
(Continued)

(56) References Cited

U.S. PATENT DOCUMENTS

| 7,705,513 | B1 | 4/2010 | West et al. |
| 2009/0025771 | A1 | 1/2009 | Stark |

(Continued)

FOREIGN PATENT DOCUMENTS

| CN | 103197719 A | 7/2013 |
| CN | 103649007 A | 3/2014 |

(Continued)

OTHER PUBLICATIONS

Gary L. Solbrekken, et al., "Thermal Management of Portable Electronic Equipment Using Thermoelectric Energy Conversion", Intersociety Conference on ITHERM, 2004, pp. 276-283.

(Continued)

*Primary Examiner* — Matthew T Martin
(74) *Attorney, Agent, or Firm* — Muncy, Geissler, Olds & Lowe, P.C.

(57) ABSTRACT

A thermoelectric converter includes a battery box, an outer box and a connecting ring. The battery box has a bottom case, a battery disposed in the bottom case, a battery circuit board electrically connected to the battery, and an application circuit board disposed at one end of the bottom case. The outer box has a heat sink surrounding and covering the battery box, a thermoelectric module electrically connected to the battery circuit board with the thermoelectric module electrically connected to the battery through the battery circuit board, a heat conducting plate overlying the thermoelectric module and configured to conduct thermal energy from ambient environment to the thermoelectric module for the thermoelectric module to absorb the thermal energy and convert the thermal energy to electricity, and a non-metal adiabatic frame surrounding the thermoelectric module and configured to prevent the thermal energy from being dissipated to the ambient environment.

17 Claims, 6 Drawing Sheets

(51) Int. Cl.

| | |
|---|---|
| *H01M 10/6552* | (2014.01) |
| *H01L 35/34* | (2006.01) |
| *H01M 10/6551* | (2014.01) |
| *H01M 10/6572* | (2014.01) |
| *H01L 35/30* | (2006.01) |
| *F28D 15/02* | (2006.01) |
| *H01M 10/647* | (2014.01) |
| *F28D 15/04* | (2006.01) |
| *H01L 35/00* | (2006.01) |
| *H01M 10/0587* | (2010.01) |
| *H01M 10/052* | (2010.01) |

(52) U.S. Cl.
CPC ............ *F28D 15/046* (2013.01); *H01L 35/30* (2013.01); *H01L 35/34* (2013.01); *H01M 10/613* (2015.04); *H01M 10/647* (2015.04); *H01M 10/6551* (2015.04); *H01M 10/6552* (2015.04); *H01M 10/6572* (2015.04); *H01L 35/00* (2013.01); *H01M 10/052* (2013.01); *H01M 10/0587* (2013.01)

(58) Field of Classification Search
CPC ......... H01M 10/6551; H01M 10/6552; H01M 10/6572; H01M 10/613; H01M 10/052; H01M 10/0587; F28D 15/0233; F28D 15/0275; F28D 15/046
See application file for complete search history.

(56) References Cited

U.S. PATENT DOCUMENTS

| | | |
|---|---|---|
| 2010/0005572 A1 | 1/2010 | Chaplin |
| 2012/0153772 A1 | 6/2012 | Landa et al. |
| 2012/0312345 A1 | 12/2012 | Ward et al. |
| 2013/0213058 A1 | 8/2013 | Goenka |
| 2013/0304351 A1 | 11/2013 | Gillette, II |
| 2013/0327369 A1 | 12/2013 | Jovoic et al. |
| 2014/0026567 A1 | 1/2014 | Paripati et al. |
| 2014/0034103 A1 | 2/2014 | Kellie et al. |
| 2014/0096808 A1 | 4/2014 | Moczygemba |
| 2015/0380629 A1 | 12/2015 | Kanno et al. |

FOREIGN PATENT DOCUMENTS

| | | |
|---|---|---|
| CN | 104025327 A | 9/2014 |
| JP | 2005327524 A | 11/2005 |
| JP | 2013506246 A | 2/2013 |
| JP | U3196069 U | 1/2015 |
| JP | 2015171308 A | 9/2015 |
| TW | 200845439 A | 11/2008 |
| TW | 201019515 A | 5/2010 |
| TW | 201324074 A1 | 6/2013 |
| TW | M476545 | 4/2014 |
| TW | 201422903 A | 6/2014 |
| TW | 201425887 A | 7/2014 |
| TW | M515685 U | 1/2016 |
| WO | WO2009/063805 A1 | 5/2009 |

OTHER PUBLICATIONS

Gary L. Solbrekken, et al., "Experimental Demonstration of Thermal Management Using Thermoelectric Generation", Intersociety Conference on ITHERM, 2004, pp. 284-290.

Kuang-Yu Wang, et al., "Thermal Management of a Medical Device Using Thermoelectric Coolers", IEEE Semiconductor Thermal Measurement and Management Symposium, 2004, pp. 122-124.

Jean-Pierre Fleurial, et al., "Development of Segmented Thermoelectric Multicouple Converter Technology", IEEE Aerospace Conference, 2006, pp. 1-10.

Felix Felgner, et al., "Component-Oriented Modeling of Thermoelectric Devices for Energy System Design", IEEE Transactions on Industrial Electronics, Mar. 2014, vol. 61, No. 3, pp. 1301-1310.

Hanguang Yu, et al., "The Design of Enhancing Thermoelectric Cooler System Based on Forced Air Cooling", International Conference on Systems and Informatics, 2012, pp. 576-579.

M. Kamrul Russel, et al., "Numerical and Experimental Study of a Hybrid Thermoelectric Cooler Thermal Management System for Electronic Cooling", IEEE Transactions on Components, Packing and Manufacturing Technology, Oct. 2012, vol. 2, No. 10, pp. 1608-1616.

Chun-Kai Liu, et al., "Thermoelectric Waste Heat Recovery for Automotive", 9th International Microsystems, Packaging, Assembly and Circuits Technology Conference (IMPACT), 2014, pp. 57-60.

Todd Wey, et al., "On the Behavioral Modeling of a Thermoelectric Cooler and Mechanical Assembly", Circuits and Systems, 2006, pp. 277-280.

M. Vassilev, et al., "Single Phrase Cooling System Powered by a Thermoelectric Module", IEEE Power Electronics Specialists Conference, 2008, pp. 2295-2300.

M. K. Russel, et al., "A Hybrid Thermoelectric Cooler Thermal Management System for Electronic Packaging", Intersociety Conference on ITherm, 2010, pp. 1-7.

THERMOELECTRIC CONVERTER

CROSS-REFERENCE TO RELATED APPLICATION

The present disclosure is based on, and claims priority from, Taiwan Application Number 105125590, filed Aug. 11, 2016, the disclosure of which is hereby incorporated by reference herein in its entirety.

TECHNICAL FIELD

The technical field relates to a thermoelectric converter.

BACKGROUND

The thermoelectric conversion technology converts heat energy into electricity. The greater temperature difference generates the larger power. However, a thermoelectric converter neither stores the electricity generated by the thermoelectric conversion, nor provides the electricity to the application elements.

SUMMARY

An exemplary embodiment provides a thermoelectric converter, including a battery box, an outer box, at least one connecting ring, and at least one application element. The battery box includes a battery, a bottom case, a battery circuit board, and at least one application circuit board. The battery is disposed in the bottom case. The battery circuit board overlies the bottom case and is electrically connected to the battery. The at least one application circuit board is disposed at one end of the battery box. The outer box includes a heat sink, a thermoelectric module, a heat conducting plate, and a non-metal adiabatic frame. The heat sink surrounds the battery box. The thermoelectric module absorbs and converts thermoelectric, and is electrically connected to the battery through the battery circuit board. The heat conducting plate overlies the thermoelectric module, and conducts the thermal energy from environment to the thermoelectric module. The heat conducting plate overlies the thermoelectric module, which is disposed in the non-metal adiabatic frame. The non-metal adiabatic frame surrounds the thermoelectric module and prevents the thermal energy from being dissipated to the ambient environment. The at least one connecting ring is disposed at one end at the thermoelectric converter. The at least one connecting ring includes a metal outer ring and an elastic non-metal inner ring disposed along an inner edge of the metal outer ring. The least one application element is coupled to one end of the outer box by the at least one connecting ring, electrically connected to the battery or the battery circuit board by the at least one application circuit board, and provided with power by the battery or the battery circuit board.

The foregoing will become better understood from a careful reading of a detailed description provided herein below with appropriate reference to the accompanying drawings.

DETAILED DESCRIPTION OF THE EXEMPLARY EMBODIMENTS

Figure 1A:
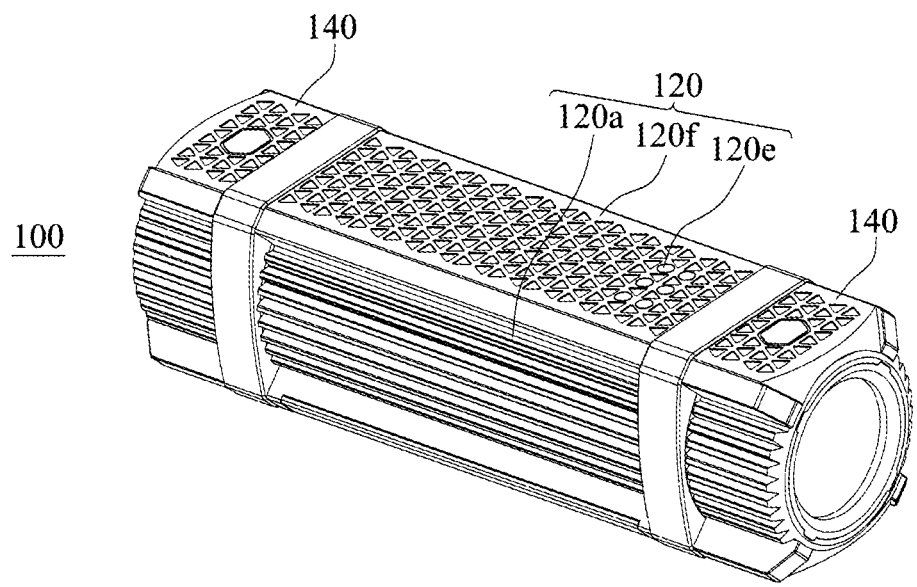
FIG. 1a shows a schematic diagram of a thermoelectric converter according to an exemplary embodiment of the disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1B:
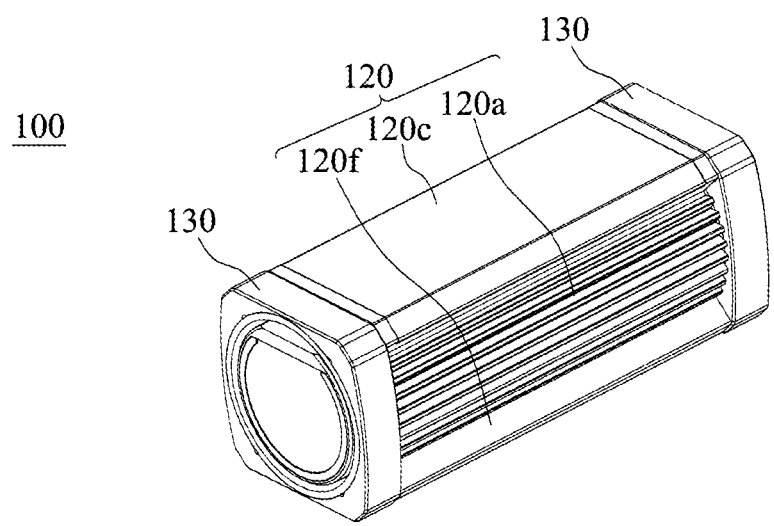
FIG. 1b shows a schematic diagram of the thermoelectric converter in another view angle according to the exemplary embodiment of the disclosure.

FIG. 1a shows a schematic diagram of a thermoelectric converter according to an exemplary embodiment of the disclosure. The thermoelectric converter 100 includes a battery box 110 (not shown), an outer box 120, at least one connecting ring 130 (not shown), and at least one application element 140. FIG. 1b shows a schematic diagram of the thermoelectric converter 100 in another view angle according to the exemplary embodiment of the disclosure.

Figure 2:
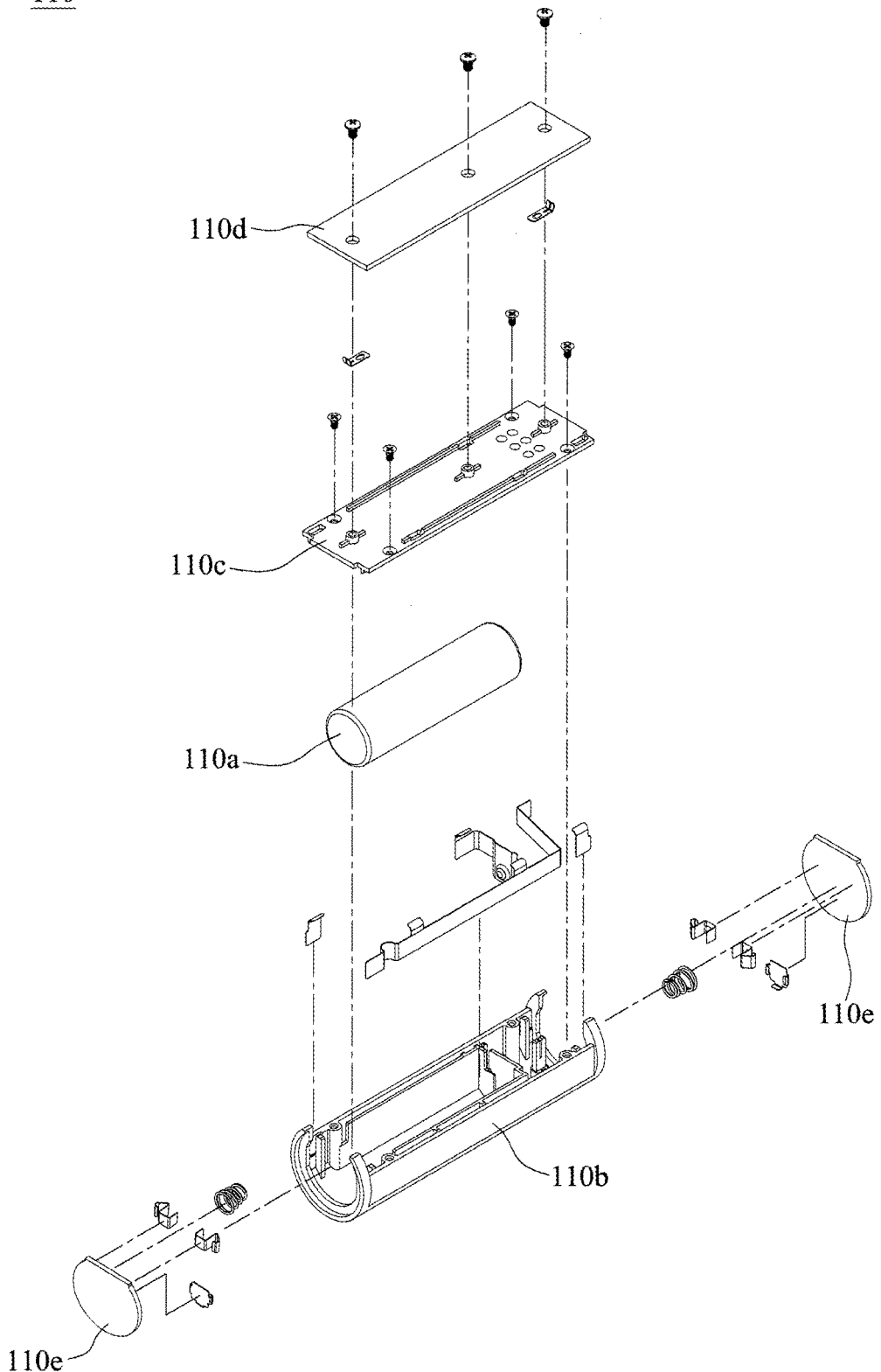
FIG. 2 is a schematic diagram showing a battery box according to an exemplary embodiment of the disclosure.

FIG. 2 is a schematic diagram showing a battery box 110 according to an exemplary embodiment of the disclosure. The battery box 110 includes a battery 110a, a bottom case 110b, a top cover 110c, a battery circuit board 110d, and at least one application circuit board 110e. The battery 110a is disposed in the bottom case 110b. The top cover 110c overlies the bottom case 110b. The battery circuit board 110d overlies the top cover 110c and is electrically connected to the battery 110a. The application circuit board 110e is disposed at one end of the battery box 110. In another exemplary embodiment, the battery box 110 includes another application circuit board 110e, which is disposed at another one end of the battery box 110.

In the exemplary embodiment, the battery circuit board 110d further includes a power management chip, an energy harvesting chip, and a controlling chip. The power management chip provides a stable output voltage without a loading effect. The energy harvesting chip is controlled for converting thermoelectric energy into electricity and has a maximum power point tracking feature. The controlling chip controls the battery circuit board to be turned on or turned off according to the temperature of the thermoelectric converter or whether the thermoelectric converter is in a short circuit.

In another exemplary embodiment, the battery circuit board 110d further includes a complex functional energy management chip and a controlling chip. The complex functional energy management chip is controlled for converting thermoelectric energy into electricity and has a maximum power point tracking feature, for managing the charge and discharge process of the battery and providing a stable output voltage without a loading effect. The controlling chip controls the battery circuit board 110d to be turned on or turned off according to the temperature of the thermoelectric converter 100 or whether the thermoelectric converter is in a short circuit.

Figure 3:
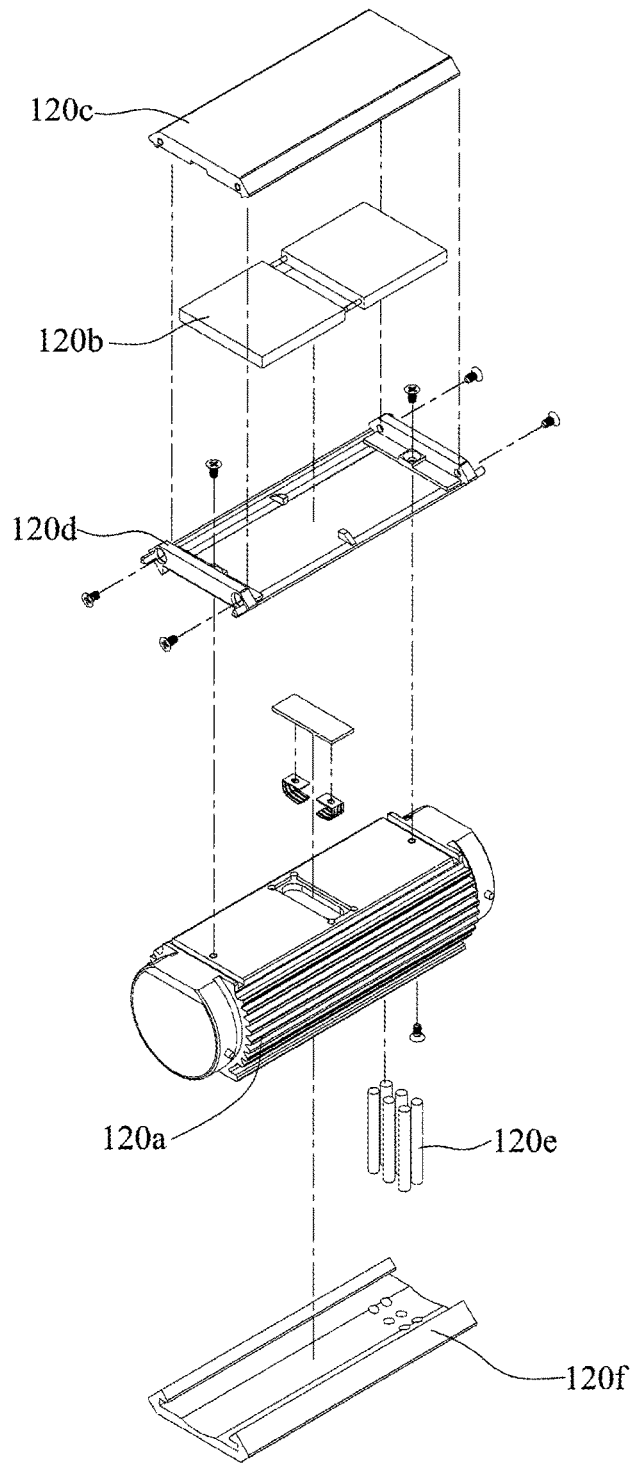
FIG. 3 is a schematic diagram showing an outer box according to an exemplary embodiment of the disclosure.

FIG. 3 is a schematic diagram showing an outer box 120 according to an exemplary embodiment of the disclosure. The outer box 120 includes a heat sink 120a, a thermoelectric module 120b, a heat conducting plate 120c, and a non-metal adiabatic frame 120d. The heat sink 120a surrounds the battery box 110. The thermoelectric module 120b absorbs and converts thermal energy into electricity, and is electrically connected to the battery 110a through the battery circuit board 110d. The heat conducting plate 120c overlies the thermoelectric module 120b, and conducts the thermal energy from ambient environment to the thermoelectric module 120b. The thermoelectric module 120b overlaid with the heat conducting plate 120c is disposed in the non-metal adiabatic frame 120d, and the non-metal adiabatic frame 120d is disposed on the heat sink 120a. The non-metal adiabatic frame 120d is disposed around the thermoelectric module 120b and prevents the thermal energy from being dissipated to the ambient environment.

In the exemplary embodiment, the thermoelectric module 120b directly contacts with the heat conducting plate 120c and the heat sink 120a. In another exemplary embodiment, thermal grease is smeared between the thermoelectric module 120b and the heat conducting plate 120c, and between the thermoelectric module 120b and the heat sink 120a; or graphite materials, high thermal conductivity silicon or non-silicon composites are overlaid between the thermoelectric module 120b and the heat conducting plate 120c, and between the thermoelectric module 120b and the heat sink 120a.

In the exemplary embodiment, the heat sink 120a is a cooling fin. The thermal energy that is not absorbed by the thermoelectric module is dissipated by the cooling fin by increasing the contact area with air.

In the exemplary embodiment, the heat conducting plate 120c is made of a material selected from the group consisting of aluminum, copper, silver, and gold.

In the exemplary embodiment, the heat sink 120a is made of a material selected from the group consisting of aluminum, copper, silver, and gold.

In the exemplary embodiment, the heat conducting plate 120c and the heat sink 120a are processed by an anodizing treatment or a surface treatment to increase the hardness.

In the exemplary embodiment, the outer box 120 further includes a plurality of light pipes 120e electrically connected to the battery circuit board, and a number of displaying of the plurality of light pipes 120e is controlled by the battery circuit board 110d according to a remaining power of the battery 110a.

In the exemplary embodiment, the outer box 120 further includes a heat insulation layer 120f disposed at a bottom of the outer box 120. The heat insulation layer 120f is made of silicon, rubber or plastic.

Figure 4A:
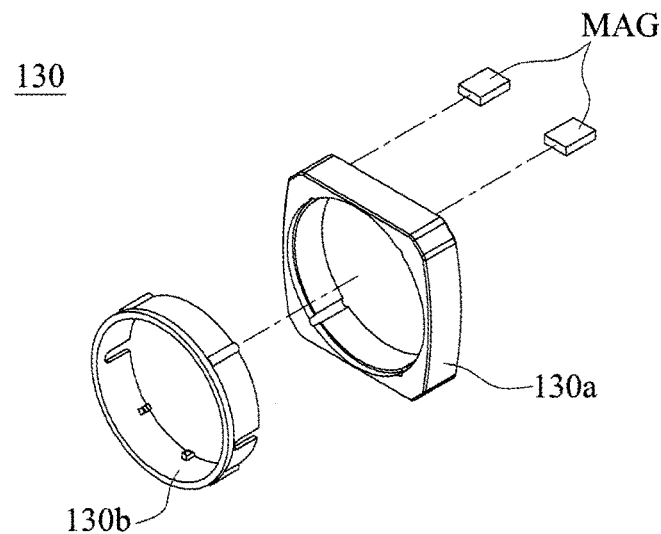
FIG. 4a and FIG. 4b are schematic diagrams showing connecting rings according to an exemplary embodiment of the disclosure.
Figure 4B:
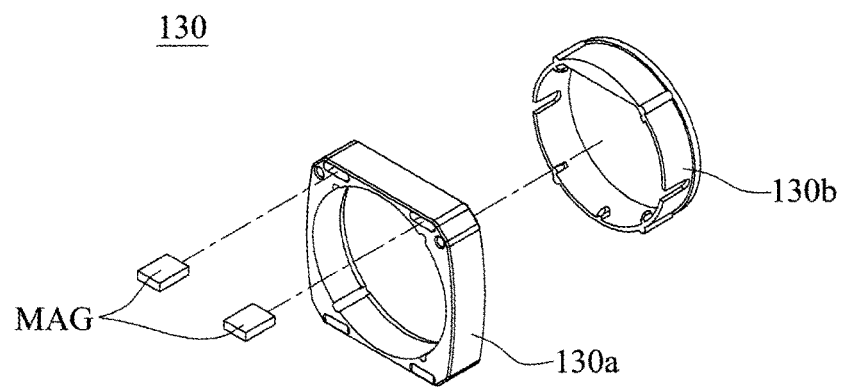

FIG. 4a and FIG. 4b are schematic diagrams showing connecting rings according to an exemplary embodiment of the disclosure. The connecting ring 130 is disposed at one end of the thermoelectric converter 100. The connecting ring 130 includes a metal outer ring 130a and an elastic non-metal inner ring 130b disposed along an inner edge of the metal outer ring. In another exemplary embodiment, the thermoelectric converter 100 includes another connecting ring 130 disposed at another end of the thermoelectric converter 100.

In the exemplary embodiment, the metal outer ring 130a has a plurality of grooves and a plurality of magnets MAG embedded into the plurality of grooves, and the least one connecting ring 130 attracts the outer box 120 by the magnets. In another exemplary embodiment, the heat conducting plate 120c is a magnetic heat conducting plate that attracts a metal thermal energy source.

Figure 5A:
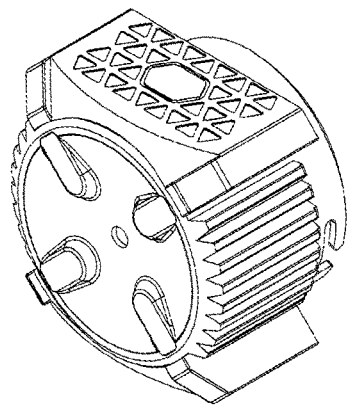
FIG. 5a and FIG. 5b are schematic diagrams showing application elements according to an exemplary embodiment of the disclosure.
Figure 5B:
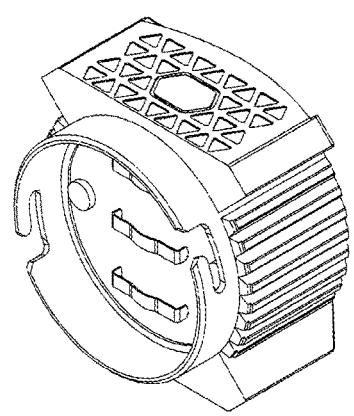

FIG. 5a and FIG. 5b are schematic diagrams showing application elements according to an exemplary embodiment of the disclosure. Referring to FIG. 5a, the application element 140 is coupled to one end of the outer box 120 by the connecting ring 130, electrically connected to the battery 110a or the battery circuit board 110d by the application circuit board 110e, and provided with power by the battery 110a or the battery circuit board 110d. Referring to FIG. 5b, in another exemplary embodiment, the thermoelectric converter 100 includes another application element 140 coupled to another end of the outer box 120 by the connecting ring 130, electrically connected to the battery 110a by the application circuit board 110e, and provided with power by the battery 110a.

In the exemplary embodiment, the application element 140 is a lighting device, a laser point, a power bank, or a positioning device.

Figure 6:
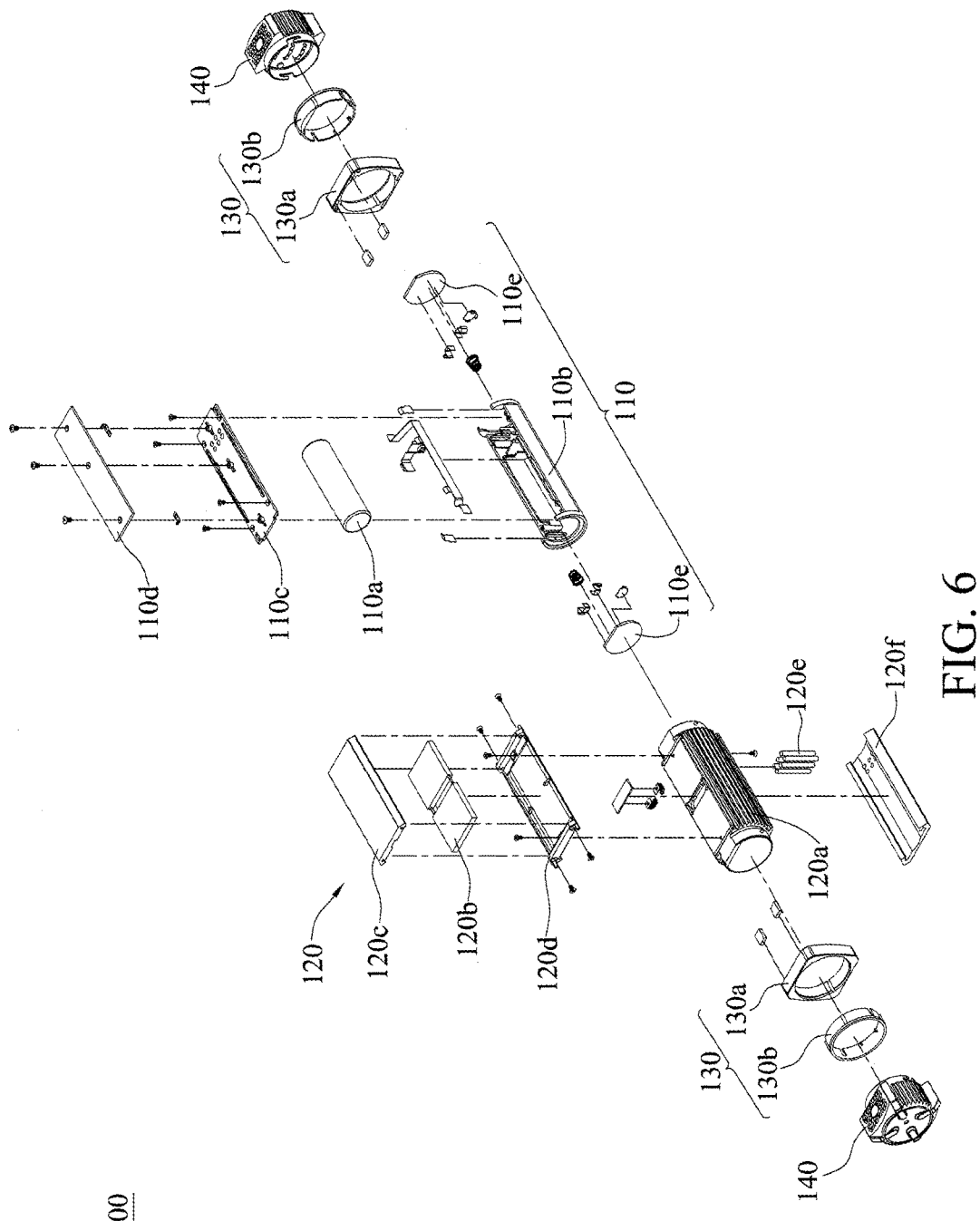
FIG. 6 is an assembling diagram showing the thermoelectric converter according to an exemplary embodiment of the disclosure.

FIG. 6 is an assembling diagram showing the thermoelectric converter according to an exemplary embodiment of the disclosure. The dotted line indicates the relative position of the various components of the assembly.

According to the exemplary embodiment of the disclosure, the thermoelectric conversion device, the energy storage components, and the application elements are integrated in a thermoelectric converter, and the energy generated by the thermoelectric conversion device is stored in the battery and provided to the application elements of the thermoelectric converter.

It is intended that the specification and examples be considered as exemplary embodiments only, with a true scope of the disclosure being indicated by the following claims and their equivalents.

What is claimed is:
1. A thermoelectric converter, comprising:
   a battery box, comprising:
      a bottom case;
      a battery disposed in the bottom case;
      a battery circuit board overlying the bottom case and electrically connected to the battery; and
      at least one application circuit board disposed at one end of the bottom case;
   an outer box, comprising:
      a heat sink surrounding and covering the battery box;
      a thermoelectric module electrically connected to the battery circuit board with the thermoelectric module electrically connected to the battery through the battery circuit board;
      a heat conducting plate overlying the thermoelectric module and configured to conduct thermal energy from ambient environment to the thermoelectric module for the thermoelectric module to absorb the thermal energy and convert the thermal energy to electricity; and
      a non-metal adiabatic frame surrounding the thermoelectric module and configured to prevent the thermal energy from being dissipated to the ambient environment; and
   at least one connecting ring disposed at one end of the outer box and comprising a metal outer portion and an elastic non-metal inner portion disposed along an inner edge of the metal outer portion.

2. The thermoelectric converter of claim 1, wherein the metal outer portion has a plurality of grooves embedded with a plurality of magnets configured to magnetically couple the outer box.

3. The thermoelectric converter of claim 1, wherein the heat conducting plate is a magnetic heat conducting plate and is configured to absorb heat from a metal material.

4. The thermoelectric converter of claim 1, wherein the thermoelectric module directly contacts at least one of the heat conducting plate and the heat sink.

5. The thermoelectric converter of claim 1, further comprising at least one of thermal grease, graphite material, high thermal conductivity silicon and non-silicon composite formed between the thermoelectric module and the heat conducting plate or between the thermoelectric module and the heat sink.

6. The thermoelectric converter of claim 1, further comprising at least one of thermal grease, graphite material, high thermal conductivity silicon and non-silicon composite formed between the thermoelectric module and the heat conducting plate and between the thermoelectric module and the heat sink.

7. The thermoelectric converter of claim 1, wherein the heat sink is a cooling fin configured to dissipate thermal energy not absorbed by the thermoelectric module.

8. The thermoelectric converter of claim 1, wherein at least one of the heat conducting plate and the heat sink is composed of a material selected from the group consisting of aluminum, copper, silver, and gold.

9. The thermoelectric converter of claim 1, wherein at least one of the heat conducting plate and the heat sink is processed by an anodizing treatment or a surface treatment to increase hardness thereof.

10. The thermoelectric converter of claim 1, wherein the battery circuit board comprises:
  a power management chip configured to provide a stable output voltage without a loading effect;
  an energy harvesting chip configured to control and convert thermoelectric energy and track a maximum power point; and
  a controlling chip configured to control the battery circuit board to be turned on or turned off according to the temperature of the thermoelectric converter or whether the thermoelectric converter is in a short circuit.

11. The thermoelectric converter of claim 1, wherein the battery circuit board comprises:
  a complex functional energy management chip configured to track a maximum power point, control and convert thermoelectric energy, manage charging and discharging processes of the battery, and provide a stable output voltage without a loading effect; and
  a controlling chip configured to control the battery circuit board to be turned on or turned off according to the temperature of the thermoelectric converter or whether the thermoelectric converter is in a short circuit.

12. The thermoelectric converter of claim 1, wherein the outer box comprises a plurality of light pipes electrically connected to the battery circuit board with the battery circuit board configured to control a display number of the plurality of light pipes according to remaining power of the battery.

13. The thermoelectric converter of claim 1, wherein the outer box comprises a heat insulation layer disposed on the bottom of the outer box.

14. The thermoelectric converter of claim 13, wherein the heat insulation layer is composed of silicon, rubber or plastic material.

15. The thermoelectric converter of claim 1, further comprising at least one application element having at least one application circuit board and coupled to one end of the outer box through the at least one connecting ring.

16. The thermoelectric converter of claim 15, wherein the at least one application element is electrically connected to the battery or the battery circuit board by the at least one application circuit board for the battery or the battery circuit board to provide power.

17. The thermoelectric converter of claim 15, wherein the at least one application element is a lighting device, a laser point, a power bank, or a positioning device.

* * * * *